(12) United States Patent
Smetana

(10) Patent No.: US 6,211,721 B1
(45) Date of Patent: Apr. 3, 2001

(54) MULTIPLEXER WITH SHORT PROPAGATION DELAY AND LOW POWER CONSUMPTION

(75) Inventor: Kenneth Smetana, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/221,419

(22) Filed: Dec. 28, 1998

(51) Int. Cl.[7] .................................................. H03K 17/62
(52) U.S. Cl. ............................ 327/407; 327/99; 326/126
(58) Field of Search ................................... 327/407, 408, 327/411, 99; 326/126, 127, 48, 52

(56) References Cited

U.S. PATENT DOCUMENTS

| | | | |
|---|---|---|---|
| 3,639,781 | 2/1972 | Marley | 326/105 |
| 3,838,296 | 9/1974 | McLeod | 326/105 |
| 4,486,880 | 12/1984 | Jeffrey et al. | 370/537 |
| 4,628,216 * | 12/1986 | Mazumder | 326/126 |
| 4,905,238 | 2/1990 | Rinaldis | 370/537 |
| 5,075,574 * | 12/1991 | Boudon | 326/127 |
| 5,210,450 | 5/1993 | Parkinson | 327/269 |
| 5,801,571 * | 9/1998 | Allen et al. | 327/407 |

* cited by examiner

Primary Examiner—Timothy P. Callahan
Assistant Examiner—Minh Nguyen
(74) Attorney, Agent, or Firm—Gray Cary Ware Freidenrich

(57) ABSTRACT

A digital multiplexer with low power consumption and a data to output propagation delay of about one gate includes a plurality of pairs of emitter coupled input transistors. The emitters of each pair of input transistors are connected to the collector of a corresponding selection transistor. The emitters of the selection transistors are connected to a main current source. The data at a selected pair of complimentary data inputs is transmitted to complimentary outputs by activating the selection transistor connected to the pair of input transistors corresponding with the selected inputs, thereby connecting the current source in series with those input transistors. The power consumption of the multiplexer is low because the single main current source is used for all of the inputs. Cascode transistors are connected between the collectors of the input transistors and the bases of output transistors. The cascode transistors isolate the bases of the output transistors from the relatively large capacitance associated with the collectors of the input transistors, enabling the output transistors to switch more quickly, which reduces the data to output propagation delay. Additionally, bleed current sources are connected to the emitters of the cascode transistors. The bleed currents keep the cascode transistors always "on" in a conducting state, which enables the cascode transistors to switch more quickly, thereby reducing the data to output propagation delay. Accordingly, the multiplexer has low power consumption and a short data to output propagation delay.

18 Claims, 2 Drawing Sheets

MULTIPLEXER WITH SHORT PROPAGATION DELAY AND LOW POWER CONSUMPTION

BACKGROUND OF THE INVENTION

1. Field of the Invention

The invention relates to multiplexers of digital signals. More particularly, the invention concerns a digital multiplexer with a short data to output propagation delay and low power consumption.

2. Description of the Related Art

Multiplexers, which are common components of digital logic systems, allow one of a number of inputs to be connected to an output. It is desirable to transmit data from an input of a multiplexer to the output of the multiplexer with as little delay as possible, and with as little power dissipation as possible.

A conventional implementation of a 16:1 multiplexer is to cascade a number of 2:1 multiplexers, as shown in FIG. 1. Alternatively, other sized multiplexers, for example 4:1 multiplexers, can be cascaded in a similar fashion. In the multiplexer in FIG. 1, D1, D2, . . . D16 are the data inputs, Y is the output, and S0, S1, S2, and S3 are the select lines. Because each 2:1 multiplexer adds one gate delay, this circuit requires four gate delays to transmit data from an input to the output. Also, because each 2:1 multiplexer requires a current source, this circuit requires fifteen current sources.

In order to reduce power consumption, and also to reduce the data to output propagation delay, which is the time from when a data input changes state to the time that the output changes state, it is known in the art to construct a multiplexer that does not require a cascade of smaller multiplexers, and in which a single current source is used for all of the inputs. However, the data to output propagation delay for these multiplexers is still too long for many applications. The data to output propagation delay in these multiplexers is too long primarily due to the relatively large amount of capacitance associated with the collector(s) of the input transistors, which is connected to the base of the output transistor.

Consequently, there is a need for a multiplexer with low power consumption and with a reduced data to output propagation delay.

SUMMARY OF THE INVENTION

Broadly, the invention concerns a digital multiplexer that has low power consumption, and a data to output propagation delay of about one gate.

An illustrative embodiment of the multiplexer of the invention comprises a plurality of pairs of emitter coupled input transistors, with each pair comprising a first input transistor and a second input transistor. Pairs of complimentary data inputs are connected to the bases of corresponding pairs of input transistors. The multiplexer also includes a plurality of selection transistors, with the collector of each selection transistor being connected to the emitters of a corresponding pair of input transistors. The emitters of the selection transistors are connected to a main current source. The data at a pair of complimentary data inputs is transmitted to the complimentary outputs by activating the selection transistor connected to the pair of input transistors corresponding with the inputs to be transmitted to the outputs. When a selection transistor is activated, the current source is connected in series with the corresponding pair of input transistors, causing the data at the data inputs at the bases of those input transistors to be transmitted to the complimentary outputs. The power consumption of the multiplexer is low because the single main current source is used for all of the inputs.

In order to reduce the propagation delay between the data inputs and the outputs, cascode transistors are connected between the collectors of the input transistors and the bases of the output transistors. Specifically, the emitter of a first cascode transistor is connected to the collector of each of the first input transistors, and the collector of the first cascode transistor is connected to the base of a first output transistor. Similarly, the emitter of a second cascode transistor is connected to the collector of each of the second input transistors, and the collector of the second cascode transistor is connected to the base of a second output transistor. The cascode transistors isolate the relatively large capacitance associated with the collectors of the first and second input transistors, from the bases of the output transistors, thereby enabling the outputs to switch more quickly, which reduces the data to output propagation delay.

Additionally, bleed current sources are connected to the emitters of the cascode transistors. The bleed currents keep the cascode transistors always "on" in a conducting state, which enables the cascode transistors to switch more quickly, thereby reducing the data to output propagation delay. The currents also keep the voltages at the emitters of the cascode transistors nearly constant regardless of the state of the inputs. Each bleed current source has a current of about 60% of the current of the main current source.

The invention can be implemented in several embodiments. For example, the invention can be implemented with discrete components, or can be implemented in an integrated circuit.

The invention provides the advantages of low power consumption and a short data to output propagation delay of only about one gate. The invention also provides other advantages and benefits, which are apparent from the following description.

DETAILED DESCRIPTION OF THE PREFERRED EMBODIMENTS

The invention concerns a digital multiplexer that has low power consumption, and a data to output propagation delay of about one gate. The nature, objects, and advantages of the invention will become more apparent to those skilled in the art after considering the following detailed description in connection with the accompanying drawings.

Figures 2, 3, 4:
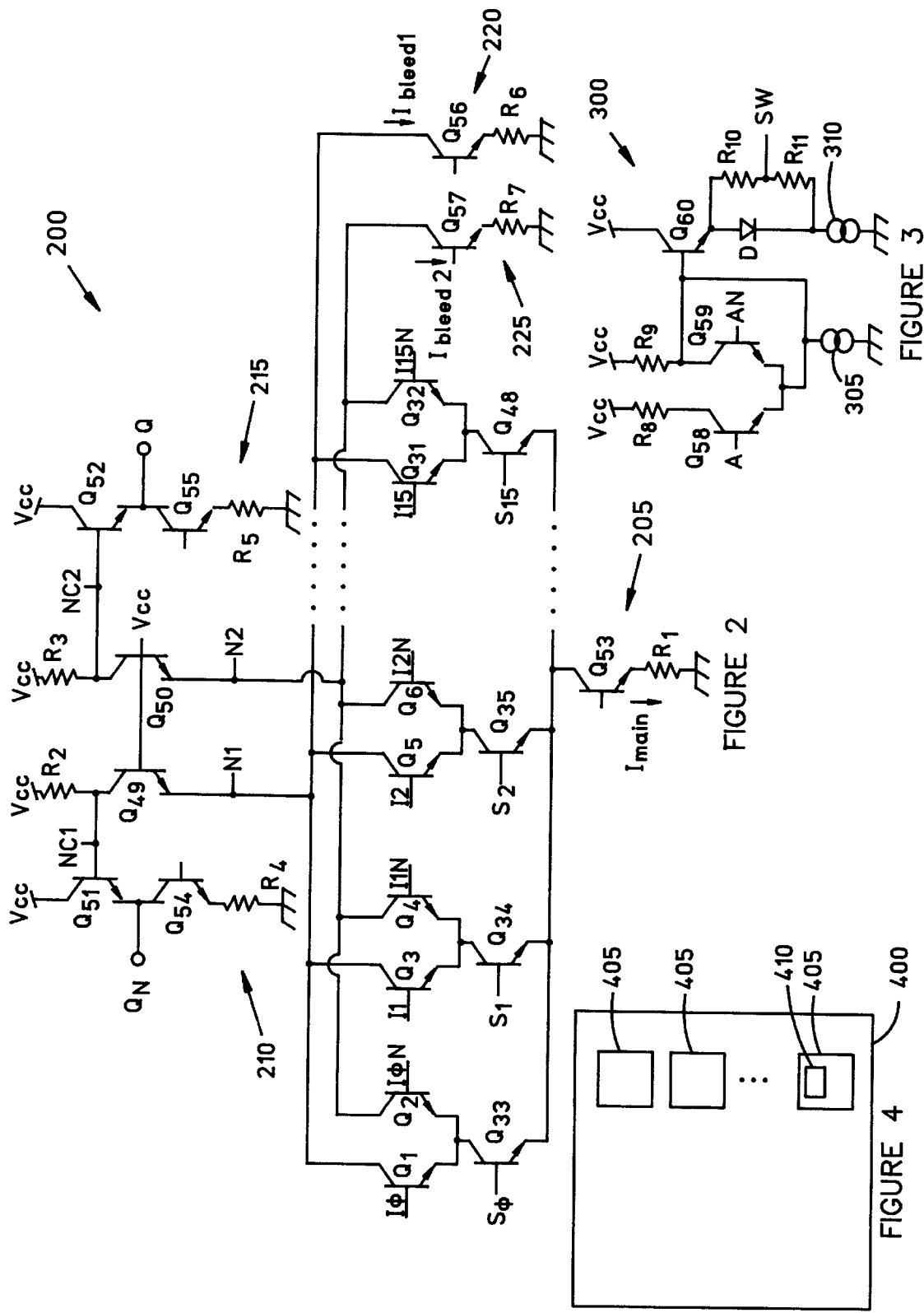
FIG. 2 is a schematic diagram of a multiplexer in accordance with an illustrative embodiment of the invention.
FIG. 3 is a schematic diagram of a circuit for producing the proper voltages for connection to the base of a selection transistor.
FIG. 4 is a plan view of an integrated circuit that includes at least one circuit that includes the multiplexer of FIG. 2.

As shown in FIG. 2, an illustrative embodiment of the multiplexer 200 of the invention includes a plurality of pairs of emitter coupled input transistors Q1–Q2, Q3–Q4, . . . Q31–Q32, with each pair comprising a first input transistor Q1, Q3, . . . Q31 and a second input transistor Q2, Q4, . . . Q32. Pairs of complimentary data inputs I0–I0N, I1–I1N, . . . I15–I15N are connected to the bases of corresponding pairs of input transistors. For example, data input I0 is connected to the base of input transistor Q1, and data input I0N, which is the logical compliment of data input I0, is connected to the base of input transistor Q2. Data inputs I0–I15 and I0N–I15N are typically driven by corresponding emitter followers from prior logic gates, which preferably have a logic high level of about Vcc-Vbe, which is a convenient and desirable level for ECL logic circuits (Vbe is the typical base to emitter voltage drop in the transistors of the multiplexer 200).

Rather than using differential inputs as described above, in an alternative embodiment, single ended inputs could be connected to the first input transistors Q1, Q3, . . . Q31. In this alternative embodiment, a fixed voltage Vbb would be connected to the bases of all of the second input transistors Q2, Q4, . . . Q32. As discussed in more detail below, in this alternative embodiment the voltage levels at the collectors and bases of the selection transistors Q33, Q34, . . . Q48 would be different than in embodiments that use differential inputs. In this alternative embodiment, in order to reduce capacitance, preferably the second input transistors would have a common collector. Differential inputs are preferred due to their increased speed and superior noise rejection.

The collector of each selection transistor Q33, Q34, . . . Q48 is connected to the emitters of a corresponding pair of input transistors. For example, the collector of selection transistor Q33 is connected to the emitters of input transistors Q1 and Q2, and the collector of selection transistor Q34 is connected to the emitters of input transistors Q3 and Q4.

Figure 1:
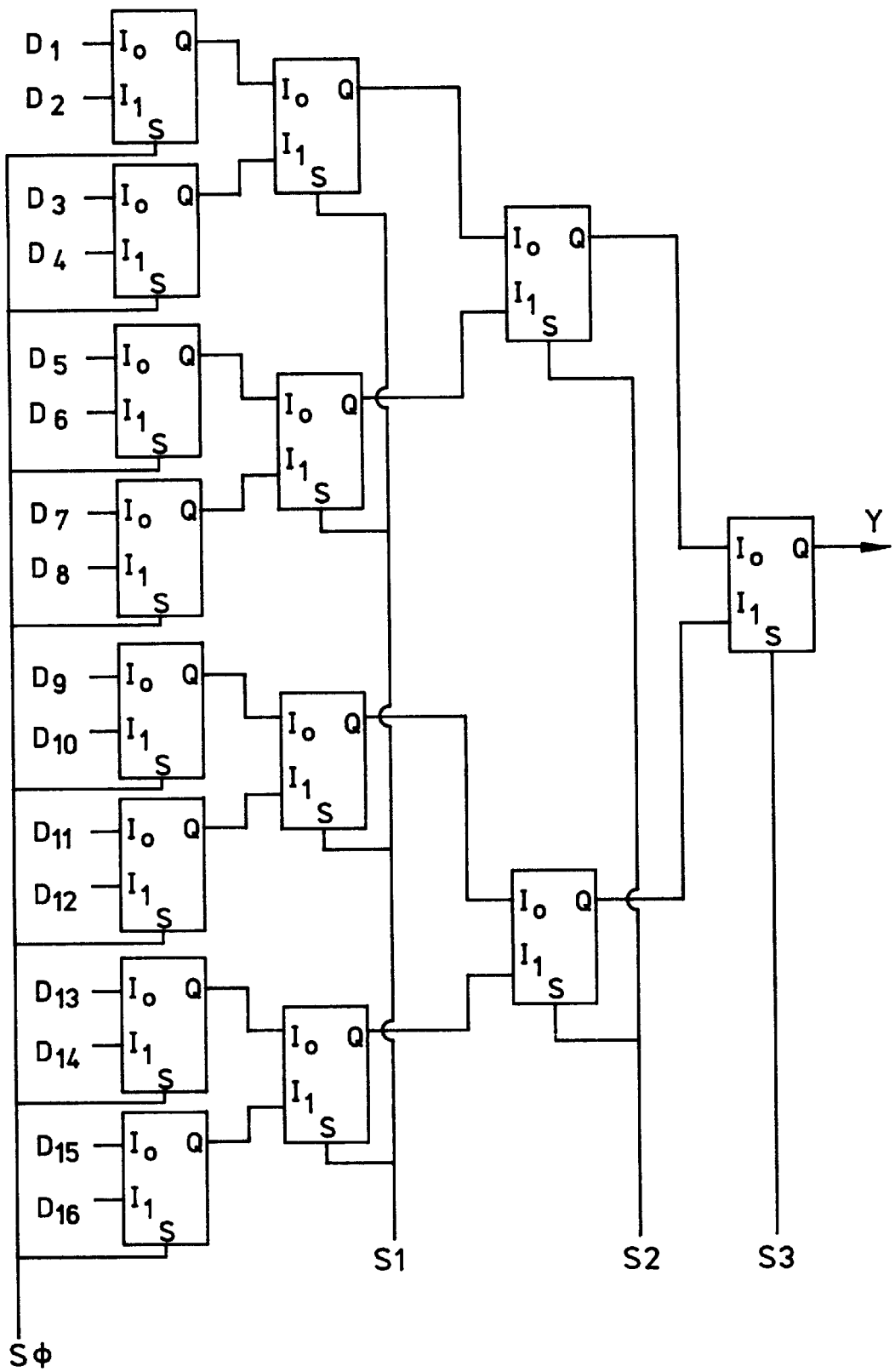
FIG. 1 is a block diagram of a prior art 16:1 multiplexer.

The emitters of the selection transistors are connected to a main current source 205. Preferably, the main current source comprises a transistor Q53 and a resistor R1. The collector of transistor Q53 is connected to the emitters of the selection transistors. One end of resistor R1 is connected to the emitter of transistor Q53, and the other end of resistor R1 is connected to ground. The base of the main current source transistor Q53 is connected to a reference voltage chosen to produce the current that is desired for the main current source. The current Imain of the main current source is technology dependent. For example, the current Imain is dependent on the number of inputs of the multiplexer, and the type of process used for manufacturing an integrated circuit containing the multiplexer, but generally is set between about 300 microamps and about 2.5 milliamps, although values outside of this range are possible. For a 16:1 multiplexer connected to a 3.3 volt supply, preferably Imain is about 1.0 milliamp. To produce this current, a voltage of about 1.1 volts, for example, could be connected to the base of transistor Q53 of the main current source. The main switch current of the multiplexer 200 (not including the bleed currents) is about $\frac{1}{15}$ the cumulative switch current of the prior art circuit of FIG. 1. The power consumption of the multiplexer 200 is low because the single main current source is used for all of the inputs.

The data at a selected pair of data inputs is transmitted to the data outputs Q and QN by activating (turning on) the selection transistor connected to the pair of input transistors corresponding with the selected pair of data inputs. Activating a selection transistor causes the main current source to be connected in series with the pair of input transistors corresponding with the selected pair of data inputs. For proper operation of the multiplexer, only one selection transistor is activated at a time. The selection transistor to be activated is activated by applying a logic level "high" voltage to the single ended select line S0–S15 connected to the base of the selection transistor to be activated, which turns the selection transistor on causing the selection transistor to conduct current between its collector and emitter.

Selection logic circuitry, for example a decoder, that can be used for activating any desired selection transistor, is widely known in the art.

In one embodiment, the multiplexer is configured to be used with a 5 volt supply voltage Vcc. However, in the preferred embodiment, the multiplexer is configured for connection to a positive supply voltage Vcc of about 3.3 volts (commonly referred to as a 3 volt supply). In all embodiments, it is necessary to ensure that the outputs of the selection logic circuitry produce voltages required for proper operation of the selection transistors. In the preferred embodiment in which Vcc is about 3.3 volts, the high logic level of the select lines S0–S15 must be about Vcc-1.5Vbe ±about 100 millivolts (where Vbe is the typical base-emitter voltage drop across the transistors used in the multiplexer). This high logic level is critical for proper circuit operation with a 3.3 volt supply. A higher high logic level would tend to saturate the corresponding selection transistor, and a lower high logic level would tend to saturate the main current source transistor Q53. In the embodiment for a 3.3 volt supply, the low logic level of the select lines is about Vcc-1.5Vbe-Vswing. The circuit 300 of FIG. 3 is an example of an output stage of a decoder that produces the required voltages. The output SW of the circuit 300 is connected to the base of a corresponding selection transistor. The circuit 300 is repeated for each selection transistor. Circuit 300 includes transistors Q58, Q59, and Q60, resistors R8, R9, R10, and R11, diode D, and current sources 305 and 310. Signals A and AN, which are complimentary signals from the selection decoder, act as inputs to the circuit 300.

In the single ended alternative embodiment discussed above in which a voltage Vbb is connected to the bases of the second input transistors Q2, Q4, . . . Q32, the voltage levels at the collectors and bases of the selection transistors would be different than in the differential embodiments. In the single ended embodiment, the minimum voltage at the collectors of the 20 selection transistors would be about Vbb-Vbe, and the voltages from the select lines S0–S15 applied to the bases of the selection transistors would have to be about ½ Vbe lower than in the differential embodiment.

In order to reduce the data to output propagation delay, which is the propagation delay between the data inputs and the outputs, cascode transistors Q49 and Q50 are connected between the collectors of the input transistors and the bases of the output transistors Q51 and Q52. Specifically, the emitter of the first cascode transistor Q49 is connected to the collector of each of the first input transistors Q1, Q3, . . . Q31 at node N1, and the collector of the first cascode transistor Q49 is connected to the base of the first output transistor Q51. Similarly, the emitter of the second cascode transistor Q50 is connected to the collector of each of the second input transistors Q2, Q4, . . . Q32, at node N2, and the collector of the second cascode transistor Q50 is connected to the base of a second output transistor Q52.

The cascode transistors isolate the relatively large capacitance at nodes N1 and N2 associated with the collectors of the first and second input transistors, from the bases of the output transistors Q51 and Q52, which are the true "voltage switching nodes," nodes NC1 and NC2. Nodes NC1 and NC2 have much less capacitance than nodes N1 and N2 and therefore are able to switch much more quickly, which reduces the data to output propagation delay. The current of the main current source can be increased to achieve even faster operation. If the cascode transistors are not used, increased switching speeds may be attained by substantially increasing the current of the main current source, but at the cost of significantly increased power consumption.

The select propagation delay, which is the time from when a select line changes state to the time that the outputs change state, is a different circuit attribute than the data to output propagation delay, which is the time from when the selected data changes state to the time that the outputs change state. Generally, the select propagation delay is not as important as the data to output propagation delay because the data to output propagation delay is the key performance parameter in most applications. However, the select propagation delay is also reduced by using cascode transistors.

A D.C. voltage is connected to the base of each cascode transistor. Preferably, the bases of the cascode transistors are connected together so that the same voltage is applied to each base. In the 3.3 volt supply preferred embodiment, preferably the voltage applied to the bases of the cascode transistors is Vcc, in which case nodes N1 and N2 have a voltage of Vcc-Vbe. The collector of cascode transistor Q49 is connected to one end of a resistor R2 at fast voltage switching node NC1, and the other end of resistor R2 is connected to Vcc. Similarly, the collector of cascode transistor Q50 is connected to one end of a resistor R3 at fast voltage switching node NC2, and the other end of resistor R3 is connected to Vcc. Node NC1 is connected to the base of output transistor Q51, and is isolated from the load connected at output QN by output transistor Q51. Similarly, node NC2 is connected to the base of output transistor Q52, and is isolated from the load connected at output Q by output transistor Q52. When the multiplexer is connected to a 3.3 volt supply, the voltage swings at the collectors of the cascode transistors will typically be about 250–300 mV. The cascode transistors are operated so as to stay out of hard saturation. In the single ended alternative embodiment, the voltages applied to the bases of the cascode transistors would be lower than Vcc, and other related circuit voltages would also be correspondingly lowered.

The collector of first output transistor Q51 and the collector of second output transistor Q52 are connected to Vcc. The emitter of first output transistor Q51 is connected to output QN, and to a first output current source 210, which comprises transistor Q54 and a resistor R4. The collector of transistor Q54 is connected to output QN. One end of resistor R4 is connected to the emitter of transistor Q54, and the other end of resistor R4 is connected to ground. Similarly, the emitter of second output transistor Q52 is connected to output, Q, and to a second output current source 215 which comprises transistor Q55 and resistor R5. The collector of transistor Q55 is connected to output Q. One end of resistor R5 is connected to the emitter of transistor Q55, and the other end of resistor R5 is connected to ground. The bases of the output current source transistors Q54 and Q55 are connected to reference voltages (preferably to the same voltage), chosen to produce appropriate currents through the output current sources.

The emitter of the first cascode transistor Q49 (node N1) is connected to a first bleed current source 220 which comprises transistor Q56 and resistor R6. The collector of transistor Q56 is connected to node N1. One end of resistor R6 is connected to the emitter of transistor Q56, and the other end of resistor R6 is connected to ground. The emitter of the second cascode transistor Q50 (node N2) is connected to a second bleed current source 225 which comprises transistor Q57 and resistor R7. One end of resistor R7 is connected to the emitter of transistor Q57, and the other end of resistor R7 is connected to ground.

The bleed currents Ibleed1 and Ibleed2 produced respectively by the first bleed current source and the second bleed current source keep the cascode transistors always "on" in a conducting state, enabling the cascode transistors to switch faster, which reduces the data to output propagation delay. The bleed currents keep the cascode transistors in a higher frequency region because the frequency limit of operation of a transistor is a function of the collector current. The bleed currents also keep the voltages at the emitters of the cascode transistors (nodes N1 and N2) nearly constant regardless of the state of the data inputs, which facilitates faster switching of these transistors, and reduces the Miller effect by preventing the voltages at nodes N1 and N2 from falling appreciably.

Each bleed current source preferably has a current that is no greater than about 60% of the current of the main current source. Most preferably, each bleed current source has a current that is about 60% of the current of the main current source. The current of the first bleed current source is preferably about equal to the current of the second bleed current source. The bases of the bleed current source transistors Q56 and Q57 are connected to reference voltages (preferably to the same voltage), chosen to produce the desired currents through the bleed current sources. The bleed currents are typically set between about twenty percent and about sixty percent of the current of the main current source. For a 16:1 multiplexer connected to a 3.3 volt supply, preferably each bleed current is about four hundred microamps. Although all of the current sources described in the illustrative embodiment of the invention discussed herein comprise a resistor connected to the emitter of a transistor, any other current sources that are capable of producing the desired currents could be used.

Voltage levels for the illustrative embodiment of the multiplexer 200 described herein are generally about as follows:

High logic level voltage on the bases of the input transistors: Vcc-Vbe;

Voltage at the collectors of the selection transistors: Vcc-2Vbe;

High logic level voltage at the bases of the selection transistors: Vcc-1.5Vbe;

Voltage at the emitters of the selection transistors: Vcc-2.5Vbe (for example, if Vcc=3.0 volts: 3.0V–2.1V= 0.9V);

Voltage across the resistor R1 of the main current source: Vbe/4.

FIG. 4 illustrates the preferred embodiment of the invention in which the multiplexer of the invention is incorporated into a monolithic integrated circuit (IC) device 400, which includes all of the elements of the multiplexer 200 shown in FIG. 2, on a substrate of silicon material. The IC 400 includes one or more circuits 405, with at least one of the circuits including a multiplexer 410 that includes all of the elements of the multiplexer 200 shown in FIG. 2. Any circuit or circuits that include a multiplexer 410 may also include additional circuit elements.

Known integrated circuit manufacturing techniques provide for the fabrication of circuit components such as resistors and transistors, and provide for the fabrication of entire circuits. The IC 400 could be built with a number of known processes. For example, bipolar processes producing a unity gain frequency of the transistors, Ft, between about three gigahertz and about fifty gigahertz or more could be used, with a value of about 25 gigahertz being typical. Preferably, the IC is built with the fastest economically practical process.

In an alternative embodiment, a multiplexer in accordance with the invention could be assembled with a number of different IC chips and discrete components. In another alternative embodiment, a multiplexer in accordance with the invention could be assembled with discrete transistors and resistors.

Although a 16:1 multiplexer 200 has been described herein as an illustrative embodiment of the invention, the invention can be implemented as a multiplexer having more than sixteen inputs or less than 16 inputs, and generally can be implemented with any desired number of inputs. The invention may generally be implemented in any cross point switch. Additionally, the invention may be implemented in circuits configured to operate with any supply voltage Vcc at which the components will operate, and is not limited to values of Vcc of 5 volts and 3.3 volts. For example, values of Vcc less than 3.3 volts, between 3.3 volts and 5 volts, and greater than 5 volts, could be used. Further, the multiplexer of the invention may generally be implemented in any type of logic circuit family, for example ECL (preferred), CML (current mode logic), or CMOS. A CMOS embodiment may include source coupled NMOS transistors.

In view of the above description, it is apparent that the multiplexer of the invention provides the advantages of reduced power consumption, and a short data to output propagation delay of about one gate delay. Thus, the speed x power product is advantageously small. The invention also provides the advantages of a tight integrated circuit layout, and also has very little delta Tpd (difference in the propagation delay time, referred to as skew) from any data input to the outputs.

Illustrative embodiments of the invention, including what are presently considered to be the preferred embodiments of the invention, have been described herein. However, it will be apparent to those skilled in the art that various changes and modifications can be made without departing from the scope of the invention as defined by the appended claims. While illustrative embodiments of the invention have been discussed herein, it is not intended that the invention should be limited to only the embodiments discussed herein. Rather, the invention should be limited only by the scope of the claims.

What is claimed is:

1. A multiplexer, comprising:
    a plurality of pairs of emitter coupled input transistors, each pair of emitter coupled input transistors comprising a first input transistor and a second input transistor;
    a plurality of selection transistors, the collector of each selection transistor being connected to the emitters of a corresponding pair of input transistors;
    a main current source, the emitters of the selection transistors being connected to the main current source;
    a first cascode transistor, the emitter of the first cascode transistor being connected to the collector of each of the first input transistors;
    a second cascode transistor, the emitter of the second cascode transistor being connected to the collector of each of the second input transistors; and
    a first bleed current source connected to the emitter of the first cascode transistor.

2. The multiplexer of claim 1 wherein the first bleed current source has a current that is no greater than about 60% of the current of the main current source.

3. The multiplexer of claim 2 further comprising a second bleed current source connected to the emitter of the second cascode transistor.

4. The multiplexer of claim 3 wherein the second bleed current source has a current that is no greater than about 60% of the current of the main current source.

5. The multiplexer of claim 4 wherein the current of the first bleed current source is about equal to the current of the second bleed current source.

6. The multiplexer of claim 5 wherein the bases of the cascode transistors are connected to the same D.C. voltage.

7. The multiplexer of claim 6 wherein the bases of the cascode transistors are connected to Vcc.

8. The multiplexer of claim 7 further comprising a first output transistor, the collector of the first cascode transistor being connected to the base of the first output transistor.

9. The multiplexer of claim 8 further comprising a second output transistor, the collector of the second cascode transistor being connected to the base of the second output transistor.

10. A monolithic integrated circuit (IC) device, comprising:
    one or more circuits, at least one of the circuits comprising a multiplexer, the multiplexer including:
        a plurality of pairs of emitter coupled input transistors, each pair of emitter coupled input transistors comprising a first input transistor and a second input transistor;
        a plurality of selection transistors, the collector of each selection transistor being connected to the emitters of a corresponding pair of input transistors;
        a main current source, the emitters of the selection transistors being connected to the main current source;
        a first cascode transistor, the emitter of the first cascode transistor being connected to the collector of each of the first input transistors;
        a second cascode transistor, the emitter of the second cascode transistor being connected to the collector of each of the second input transistors; and
        a first bleed current source connected to the emitter of the first cascode transistor.

11. The IC device of claim 10 wherein the first bleed current source has a current that is no greater than about 60% of the current of the main current source.

12. The IC device of claim 11 further comprising a second bleed current source connected to the emitter of the second cascode transistor.

13. The IC device of claim 12 wherein the second bleed current source has a current that is no greater than about 60% of the current of the main current source.

14. The IC device of claim 13 wherein the current of the first bleed current source is about equal to the current of the second bleed current source.

15. The IC device of claim 14 wherein the bases of the cascode transistors are connected to the same D.C. voltage.

16. The IC device of claim 15 wherein the bases of the cascode transistors are connected to Vcc.

17. The IC device of claim 16 further comprising a first output transistor, the collector of the first cascode transistor being connected to the base of the first output transistor.

18. The IC device of claim 17 further comprising a second output transistor, the collector of the second cascode transistor being connected to the base of the second output transistor.

* * * * *